US007038223B2

(12) United States Patent
Starcher

(10) Patent No.: US 7,038,223 B2
(45) Date of Patent: May 2, 2006

(54) CONTROLLED CHARGE NEUTRALIZATION OF ION-IMPLANTED ARTICLES

(75) Inventor: Ronald Starcher, Brookfield, MA (US)

(73) Assignee: Burle Technologies, Inc., Wilmington, DE (US)

( * ) Notice: Subject to any disclaimer, the term of this patent is extended or adjusted under 35 U.S.C. 154(b) by 0 days.

(21) Appl. No.: 10/818,233

(22) Filed: Apr. 5, 2004

(65) Prior Publication Data

US 2005/0218344 A1    Oct. 6, 2005

(51) Int. Cl.
    *H01J 37/317*    (2006.01)
(52) U.S. Cl. ............................................. 250/492.21
(58) Field of Classification Search ........... 250/492.21, 250/492, 251, 306
    See application file for complete search history.

(56) References Cited

U.S. PATENT DOCUMENTS

| 4,804,837 | A |   | 2/1989 | Farley |              |
|-----------|---|---|--------|--------|--------------|
| 5,136,171 | A |   | 8/1992 | Leung et al. | |
| 5,286,978 | A | * | 2/1994 | Yoshida et al. | 250/492.21 |
| 5,326,980 | A | * | 7/1994 | Tajima et al. | 250/492.21 |
| 5,399,871 | A |   | 3/1995 | Ito et al. | |
| 5,621,605 | A |   | 4/1997 | Inaba et al. | |
| 5,814,819 | A |   | 9/1998 | Sinclair et al. | |
| 5,898,268 | A |   | 4/1999 | Moreshead et al. | |
| 6,043,499 | A | * | 3/2000 | Seki et al. | 250/492.21 |
| 6,239,549 | B1 |  | 5/2001 | Laprade | |

OTHER PUBLICATIONS

M.A. Noras, "Non-Contact Surface Charge/Voltage Measurements: Capacitive Probe-Principle of Operation", Trek Application Note No. 3001 (Trek Inc., Medina, NY, 2002).
M.A. Noras, "Non-Contact Surface Charge/Voltage Measurements: Fieldmeter and Voltmeter Methods", Trek Application Note No. 3002 (Trek Inc., Medina, NY, 2002).
L. Rubin et al., "Ion Implantation in Silicon Technology", *The Industrial Physicist* 9, 3 (2000).
S. Polymenakos et al., "Influence of Ge Implantation on the Mechanical Properties of Poly-crystalline silicon microstructures", *J. Micromechanics and Microengineering* 12(2002)450-457.

* cited by examiner

*Primary Examiner*—Jack I. Berman
(74) *Attorney, Agent, or Firm*—Dann, Dorfman, Herrell and Skillman, P.C.

(57) ABSTRACT

A means of neutralizing the excess charge on workpieces, such as semiconductor wafers, that results from ion-implantation processes, wherein the excess positive charge on a small area of the workpiece surface is locally sensed, and in response, an appropriate dose of charge-compensating electrons is delivered from an electron emission source to the area of excess charge on the workpiece. A charge-sensing probe and a voltage-controlled electron generator array are configurationally and operatively coupled in a closed feedback loop, and are made to scan the surface of the workpiece, in close but non-contacting proximity to the workpiece. Arrays of charge-sensing probes and electron generator arrays can be configured for rapid coverage of the implanted areas of the workpiece. The present invention has significant advantages over other methods, such as plasma and electron showers and plasma flood systems, for neutralizing the excess charge due to ion implantation.

24 Claims, 6 Drawing Sheets

CONTROLLED CHARGE NEUTRALIZATION OF ION-IMPLANTED ARTICLES

FIELD OF INVENTION

This invention relates to ion implantation processes used to selectively incorporate dopants or other impurities into materials such as semiconductors, especially as used in semiconductor microelectronics fabrication technology. More specifically, the invention relates to techniques and apparatus for measuring and neutralizing the spatially-variable, excess positively-charged regions of semiconductors resulting from such ion implantation by compensating the material with an appropriate localized dose of electrons.

BACKGROUND OF THE INVENTION

The controlled introduction of impurities into semiconductor crystals is a key process in solid-state technology, particularly for the fabrication of various electronic and optoelectronic devices, as well as for integrated circuits. Such impurities, when added to modify the electrical, optical, mechanical, or magnetic properties of a material, are referred to as 'dopants." The process of introducing dopant impurities into host materials is called 'doping.' Although the term 'impurity' often has deleterious connotations, the doping of semiconductors with certain impurities at specified concentration levels is an important technology that permits control of properties such as electrical resistivity. In semiconductors, doping is used to form internal junctions that delineate regions that differ both in conductivity and in the dominant type of charge carrier particles (i.e., negatively-charged electrons vs. positively-charged 'holes'). The junctions between distinctly doped regions of a semiconductor crystal serve as the basis of solid-state devices such as diodes, bipolar and field-effect transistors, laser diodes, detectors, light-emitting diodes, solar cells, and the like.

A common method of impurity doping is ion implantation. In ion implantation processes, and unlike dopant diffusion processes, the target material does not need to be heated to a high temperature. Consequently, ion implantation is compatible with the in-situ coatings used in photoresist-masking and patterning in order to selectively dope defined areas of semiconductor wafers. Nevertheless, ion implanted wafers are often subjected to high-temperature annealing treatments after the ion implantation in order to remove damage to the crystal structure of the wafer caused by the implantation. This post-implantation annealing does not, however, obviate the advantages of ion implantation related to the feasibility of ion implanting photoresist-coated wafers, or wafers that bear structural features such gate and field oxides, and the metal and dielectric layers that are typically encountered with integrated circuits in various stages of fabrication. These coating and delicate features are susceptible to electrostatic charge-induced damage caused by excess charge buildup during the ion implantation process.

The ion implantation process, its application to semiconductor integrated circuits, and equipment used for ion implantation are described and discussed in many texts. The ion implantation process is performed in a vacuum chamber at low pressures. In a typical implementation of ion implantation, gas-phase impurity atoms are ionized, accelerated and focused with an electric and/or magnetic field, and collimated through slits to form either a broad flux or narrow beam of ionized atoms. This ion flux is directed to impinge onto a semiconductor wafer or other type of workpiece.

Owing to the energy of the accelerated ionized impurities, the impinging ions penetrate into the target semiconductor material in a statistically predictable fashion. The resulting spatial impurity profile, i.e., impurity concentration as a function of depth beneath the exposed surface of the semiconductor, can be controlled by the energy and dose (total number of ions implanted) of the implantation. The semiconductor wafer is usually masked with patterned films of photoresist or other coating materials such as oxides, nitrides, metals, polysilicon, or polyamide. These protective films, according to their patterning by lithography, either expose or protect subareas of the wafer from penetration by the ion flux or beam. The masking and patterning of masked wafers permits spatially defining the regions of doping by the ion implantation process. Several ion implantation steps, in combination with various masking, patterning, and etching steps, can be used to compose the complex structures of integrated circuits.

Because the implanted dopant ions are electrically charged, a consequence of the ion implantation process is the buildup of electric charge on the wafer workpiece. Actually, the charge imbalance associated with ion implantation is attributed to a number of phenomenon including ejection of secondary electrons and other charged species from the wafer, and absorption of ions from the ambient. As a matter of practice, the charging effects associated with ion implantation are difficult to model. Moreover, the spatial distribution of excess charge will fluctuate over the surface of the wafer because of variations in the dopant ion beam, the variable charging characteristics of the workpiece surface, especially one that is structured with oxides, nitrides, metals, photoresists, and surface regions with different conductivities, and also according to any excess charge already present on the surface of the workpiece. Excess charge distributions will vary over the surface of a wafer, and from wafer to wafer, in a generally unpredictable fashion. To summarize, integrated circuit fabrication entails complex patterned and structured semiconductor wafer surfaces—with regions coated by materials of widely varying charging characteristics and electrical resistance, and it is therefore inevitable that the charge distribution resulting from ion implantation will exhibit much spatial variation over the surface of the workpiece.

It is widely appreciated that charging of a semiconductor device, especially during stages of device fabrication, can be harmful. Excess charge created by the ion implantation process can be troublesome. First, static charges can damage the thin oxide films that are commonly incorporated into semiconductor device structures. These phenomena are generally referred to as 'arcing' effects. Second, buildup of excess charge can interfere with the ion implantation process itself or subsequent processing steps. For example, excess charge can repel the impinging beam of ions causing beam divergence, spreading, or 'blow-up', resulting in non-uniform implantation and an inhomogeneous dopant distribution.

A simple solution to preventing charge buildup on ion-implanted wafers is to mount the wafer on an electrically conducting platen that is electrically grounded, thus providing a discharge path for excess charge deposited on the wafer during the ion implantation process. Unfortunately, grounding to electrically discharge the workpiece has proven less than completely satisfactory in many instances. The problem of excess charge and the ineffectiveness of grounding to discharge wafers is exacerbated by the use of semiconductor wafers which are of high electrical resistivity, and often are electrically insulating. For instance, many semiconductor device technologies employ sapphire substrates, silicon-on-insulator substrates, semi-insulating compound, semiconductor wafers, and the like which are poor electrical conductors. The performance of many high-speed devices depends on the use of such highly-insulating substrates in order to electrically isolate devices and minimize capacitive coupling effects. For these reasons, other methods of neutralizing excess charge build up during ion implantation, rather than relying on discharging through electrical grounding of the wafer, are needed.

Charge neutralization methods to ameliorate charging effects from ion implantation processes are used in the semiconductor industry, or else have been described or proposed in the patent and/or technical literature. A review of these techniques indicates the scope and importance of this problem for semiconductor technology and serves to highlight some of the technical issues. The need for neutralizing excess charge build up during ion implantation is generally understood and widely appreciated, and as a consequence, several distinct approaches have been developed for such purposes.

One method of charge neutralization is referred to as plasma flooding. In the plasma flooding technique, a plasma, such as an argon plasma, is generated by electrons emitted from a heated filament. The electron-containing plasma is mixed in with the ion beam to partially neutralize the beam and co-deposit compensating electrons along with positively-charged ions of the dopant ion beam on the workpiece.

A second charge neutralization technique is accomplished with an electron gun. In the electron gun method of charge neutralization, an electron beam is created by collimating the electrons emitted by a heated filament. This primary electron beam impinges on a secondary electron target which emits secondary electrons that are then directed onto the wafer to help neutralize the excess charge due to the implanted dopant ions.

A further charge neutralization technique is effected with an electron beam system. This technique uses a large-area lanthanum hexaboride cathode and collection grid to produce a high-current, low-energy electron beam. The electron beam is directed onto a workpiece to neutralize excess charge buildup on the workpiece.

The three methods described above do not allow for spatial variation in the excess charge. Nor do they permit the charge compensation to automatically adjust in response to the variation in excess charge from wafer to wafer. All of the above mentioned methods blanket the workpiece with a fixed amount of compensating charge, irrespective of the spatial details of the excess charge on a particular workpiece. As a result, there is a likelihood of over-compensating the charge on the wafer, thus yielding a wafer with excess negative charge. Further, the use of heated filaments in some of these techniques can be considered a drawback due to the fragility, short lifetime, and proneness to contamination of such filaments. In situations where a plasma is used, the complexity and non-uniformity of the plasma, is disadvantageous.

SUMMARY OF THE INVENTION

DETAILED DESCRIPTION OF THE INVENTION

The present invention provides a method and apparatus for neutralizing the problematic excess electric charge on (or in) workpiece materials such as semiconductor wafers that results from one or several ion implantation processes. The present invention represents an improvement over previous techniques in that it provides an appropriate dose of compensating electrons that is applied locally to small sub-regions of the workpiece surface that exhibit excess charge from ion implantation. The compensating electron dosage is based on a real-time measurement of the excess charge on said sub-region.

A system according to the present invention utilizes a means of sensing local charge buildup due to, for example, an ion implantation process used to selectively dope regions of a semiconductor wafer. The system includes an apparatus that senses the localized positive-ion charge distribution on a wafer and, in response to detection of said charge, delivers an appropriate quantity of compensating electron flux to neutralize the charge. Specifically, a non-contacting charge-sensing probe, such as a capacitive pick-up electrode, is scanned across a wafer that has received ion implantation. The apparatus registers a signal indicative of the localized excess charge as a function of probe position relative to the wafer. A voltage-controlled electron emission source and multiplier, hereinafter an electron generator array, provides a collimated beam of electrons that can be directed at the site of the localized excess charge sensed by the scanning probe. The probe signal, in the form of a voltage, serves as the input to a closed-loop feedback circuit that controls a high-voltage power supply that energizes the electron generator array. The compensating electron dose produced by the electron generator array and delivered to the workpiece is controlled by the magnitude of the voltage applied to the electron generator array by the high-voltage power supply. The ion implantation, sensing, and application of the neutralizing electron beam from the electron generator array can be closely coupled, both configurationally and operationally, in order to provide near real-time charge compensation.

The system according to the present invention uses a combination of charge sensing, feedback control, and wafer positioning, along with an electron beam generating device to locally neutralize excess charge on a workpiece such as a silicon wafer resulting from an ion implantation process.

Ion Implantation

Figure 1:
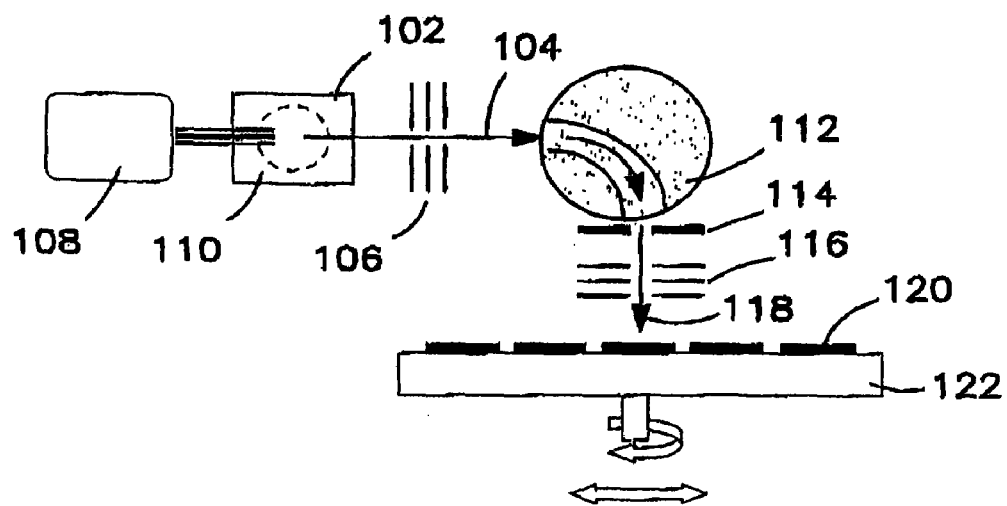
FIG. 1 is a schematic diagram of a known apparatus for ion implantation used in integrated circuit fabrication to dope batches of silicon wafers.

FIG. 1 shows schematically a simplified arrangement of an ion implanter. Commercial implanters are somewhat more sophisticated, but the charging phenomenon associated with ion implantation, the manner in which the present invention is incorporated into an ion implanter system, and the means through which the present invention effects charge neutralization can be explained in terms of the simplified ion implanter shown in FIG. 1. However, it will be noted that the present invention is not limited to a particular configuration or type of ion implanter, nor to a particular target material, nor to a particular type of workpiece, and therefore has broad applicability to ion implantation technology.

As shown in FIG. 1, an ion source 102 creates a stream of ions 104 which are accelerated and collimated by a series of voltage-biased electrodes 106. The ion source is typically realized by injecting a gas species from a reservoir 108 into the ionization chamber 110, wherein the gas is ionized by interaction with electrons emitted from a heated filament, or with a plasma, or with some combination thereof. The ion stream is filtered by a magnetic field region 112, sometimes referred to as the magnetic analyzer, which bends the ion beam owing to the resultant force associated with moving charges in a magnetic field. The magnetic analyzer, in combination with collimating slits 114 or focusing electrodes 116, selects desired ions based on their charge-dependent trajectories in a magnetic field to form an ion beam 118. After traversing the magnetic analyzer, the ion beam 118 is relatively homogeneous in both ion species and energy. A target workpiece 120, such as a silicon wafer, or several such workpieces, is/are so positioned on a platen 122 so as to intercept the ion beam 118. The platen can be moved by rotation or translation to position selected workpieces under the ion beam, or to have the ion beam scan the workpiece in a systematic fashion. Alternatively, or in some combination with moving the platen, the voltage or currents to the electrodes 116 can be modulated to effect a scanning of the ion beam over the workpiece. In either case, the entire exposed area of the workpiece can be subjected to implantation. The ions impinge the target and penetrate beneath the exposed surface of the target. The depth of penetration depends on the ion species and its energy. The dose, or total amount of implanted atoms, depends on the ion beam current and the time for which the workpiece is exposed to the ion beam. The resulting ion concentration depth profile is statistically predictable and can be accurately calculated.

A typical mode of operation for implanting silicon wafers is to place several or more silicon wafers 120 on a platen 122. The platen can be rotated and/or translated such that a single particular wafer intercepts the ion beam for a prescribed time. Meanwhile other wafers on the platen, which are outside the ion beam path, can be subjected to other process steps, such as charge neutralization. The ion beam width is commonly on the order of 1 cm. Moreover, silicon semiconductor wafers, which are invariably circular in shape, typically range in diameter from 150 millimeters (6 inches) to 300 millimeters (12 inches). Thus, the surface of the wafer remains mostly unobscured by the ion beam during the implantation process, and therefore, the silicon wafer can be subjected to other processes such as charge neutralization simultaneously with the ion implantation.

Charge Neutralization

According to the present invention, a precise dose of electrons, in the form of a collimated beam, is directed at a position on the wafer exhibiting excess positive charge resulting from an ion implantation processing step. The compensating electron beam is created by an electron generator array (EGA). The electron generator array is a voltage-controlled electron emission and multiplication source made by creating an array of microscopic channels in a sheet of specially treated glass or glass-like material. The construction and operating characteristics of the electron generator array, especially in regard to its use in the present invention, is described in more detail below. The electron generator array produces an electron flux that is induced and controlled by an applied voltage. The dose of electrons is metered out in response to the excess charge indicated by the charge-sensing probe that scans the wafer in a programmed manner. The mode of operation of the present invention may be contrasted to conventional methods of charge neutralization that are neither localized in their application to the wafer or workpiece, nor are proportioned in their compensating charge dosage as made possible by a real-time sampling and measurement of excess charge on the wafer.

Figure 2:
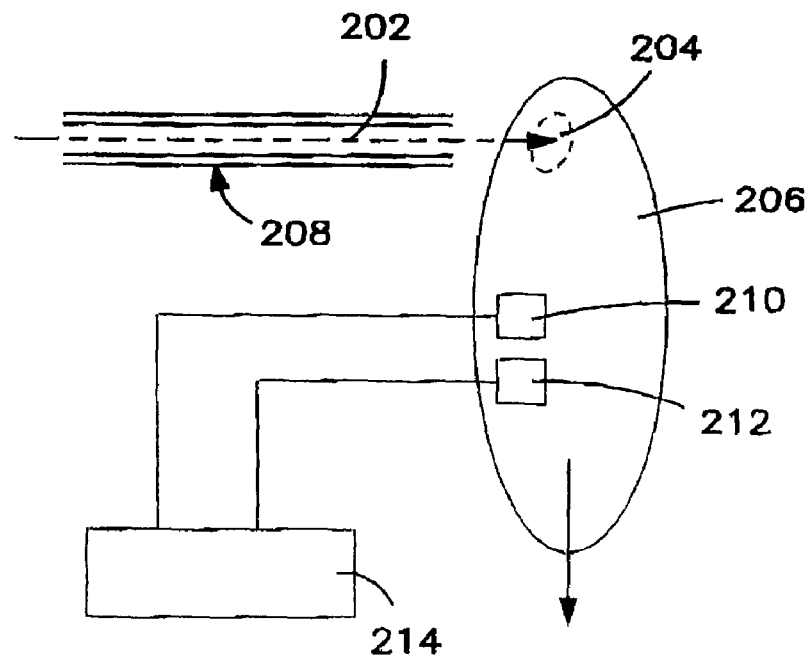
FIG. 2 is a schematic diagram of charge neutralization apparatus according to the present invention.

FIG. 2 shows schematically an embodiment of the invention in a simple form that retains and illustrates the main functional components of the invention including a means of charge sensing, a controller and power supply, a mechanism or means to scan the wafer, and a mechanism to create a localized flux of electrons to neutralize excess charge on a workpiece. A collimated ion beam 202 implants a small subsection 204 of a semiconductor wafer 206. The ion beam may be optionally shrouded by a tube or shield 208. The ion beam scans the wafer in a programmed pattern, either by motion of the ion beam itself relative to a stationary wafer, motion of the wafer relative to a stationary ion beam, or some combination thereof. A charge sensing probe element 210 follows the ion beam and assesses the localized excess charge resulting from the ion implantation. An electron generator array 212 creates a flux of electrons in an amount that will neutralize the excess positive charge resulting from the ion implantation. The electron flux produced by the electron generator arraylis controlled by an applied voltage from a controlled power supply 214. A signal from the charge-sensing element 210 is used by the controller to produce an appropriate voltage bias to the electron generator array. Thus, the coupling of the charge sensing and electron generator array constitutes a closed feedback loop. The electron flux generated in response to the charge probe signal is set by a control loop function or algorithm that is determined empirically or theoretically.

The coupling of the scanning charge sensor and the electron generator array for real-time localized charge neutralization is an important feature of the charge neutralization system according to the present invention. A control scheme using the charge-sensing probe signal as the input stimulus and the electron generator array electron flux as the output response can be implemented in various ways, with varying levels of sophistication, using circuitry and control schemes that are widely known by those skilled in the art. As an illustrative example, a simple implementation is to use a differential amplifier with an adjustable gain that amplifies the output voltage signal of the charge-sensing probe, wherein the charge-sensing probe signal is approximately proportional to the sensed excess charge. The amplifier produces an output voltage signal that controls a high-voltage power supply that, in turn, energizes the electron generator array. The dose of compensating charge is the product of the electron flux and its duration. Thus, the total dose of compensating electrons is the product of the electron generator flux (i.e., current density or electrons emitted per unit area per second) and the duration for which the flux is operative. If the flux varies, then the dose is given by the integration of flux density over time. The time for which the electron flux is operative with respect to a localized area of excess charge on the workpiece, or more specifically, the time for which a specified area of the workpiece is subjected to the electron flux, is a function of the flux area (electron beam width) A, and the speed S of the workpiece relative to the electron generator array. It is therefore straightforward to estimate the compensating dose of electrons D since $$D \text{ is proportional to } \frac{1}{s} \times \Phi \times A$$

Further, for compensation and neutralization, D should be made equal to the localized excess positive charge Q on the workpiece resulting from the ion implantation. For a charge-sensing probe that creates a voltage signal $V_S$ that is proportional to the charge, the excess charge is then given by $$Q = K_1 \times V_S$$

where $K_1$ is a proportionality constant related to the charge-sensing probe. As the flux $\Phi$ is controlled by the voltage $V_A$ applied to the electron generator array and provided by the power supply, and assuming a linear relationship between $\Phi$ and $V_A$, then the compensating dose of electrons is given by $$D = K_2 \cdot V_A$$

where $V_2$ is a proportionality constant related to the relative speed S of the wafer with respect to the electron generator array, and to characteristics of the electron generator array, including its beam area A. For neutralizing the implanted charge, $D \cong Q$, which implies a specific closed-loop voltage gain G for the control circuitry $$G = \frac{V_A}{V_S} = \frac{K_1}{K_2}$$

Further, a time delay should be considered and included to account for the lag time between the charge sensor probe and the electron generator array.

The foregoing discussion indicates the primary considerations and rudiments of a control scheme for the system. It will be understood that more sophisticated control circuitry, incorporating proportional, integral, and derivative control elements, as well as prescribed time delays, can be utilized. The means and details of specific implementation of such control circuitry are well known to those skilled in the art.

Figure 3:
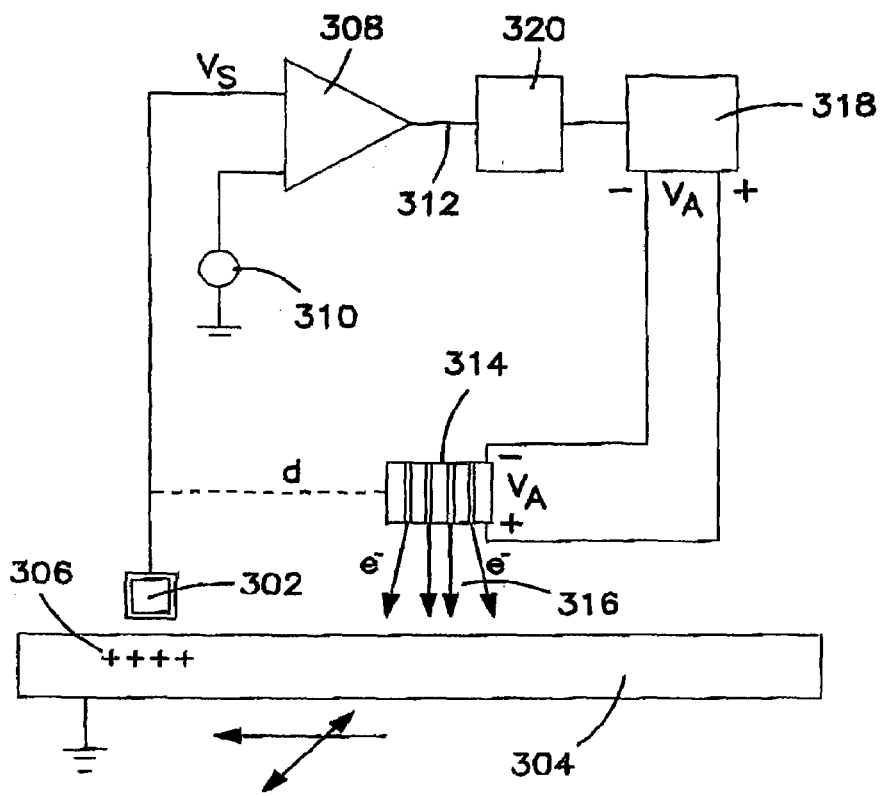
FIG. 3 is a functional block diagram/schematic diagram of an analog control circuit for use with the charge neutralization apparatus of FIG. 2.

Referring now to FIG. 3, a charge-sensing probe 302 is positioned for scanning a workpiece 304 to detect a localized excess positive charge 306 on the workpiece. The workpiece, e.g., a semiconductor wafer, is made to move in a manner and sequence such that all ion-implanted areas of the wafer will at one time or another be situated underneath the charge-sensing probe and subsequently underneath the electron generator array as well. A raster-type scanning pattern is one means to accomplish this. Alternatively, the workpiece may remain stationary and the combination of the charge-sensing probe in combination with the electron generator array 314 are made to scan over the workpiece. As still another alternative, both the workpiece and the combination of the charge-sensing probe and electron generator array may be made to independently execute motions in order to optimally and completely neutralize all excess charge on the workpiece in an effective and efficient manner.

The charge-sensing probe 302 creates a voltage signal $V_s$ that is approximately proportional to the excess charge. Said voltage signal serves as an input to a difference or differential amplifier 308 wherein it is compared with a reference voltage generated by a reference voltage source 310. The output signal 312 of the amplifier 308 is an indicator of the localized excess surface charge in the vicinity of the workpiece 304 scanned by the probe 302. An electron generator array 314 is fixedly positioned with respect to the charge-sensing probe, and follows the charge-sensing probe in a predictable way with a separation distance d. The electron generator array delivers a dose of electrons to the surface of the workpiece. The flux of the electrons 316 is proportional to an applied voltage $V_A$. The voltage $V_A$ applied to the electron generator is provided by a high-voltage power source 318. The output voltage of the power supply is controlled by the output of the difference amplifier. An appropriate time delay circuit 320 can be included between the difference amplifier 308 and the power supply 318 to account for the time lag between sensing the excess charge and applying a compensating neutralization charge. Accordingly, areas of the wafer that have been scrutinized by the charge-sensing probe are rapidly positioned directly under the electron generator array. As the workpiece motion relative to the charge-sensing probe and the electron generator array is known, the time lag between the charge-sensing by the probe and delivery of a dose of electrons from the electron generator array can be figured into the control loop for effective neutralization of the excess charge.

As an alternative to the control scheme described above, the charge sensing probe signal can be digitally sampled as input for a microprocessor unit that controls the high-voltage power supply. In that case, the processor is programmed to run an algorithm that determines the electron generator array output based on the signal generated by the scanning charge-sensing probe.

Figure 4:
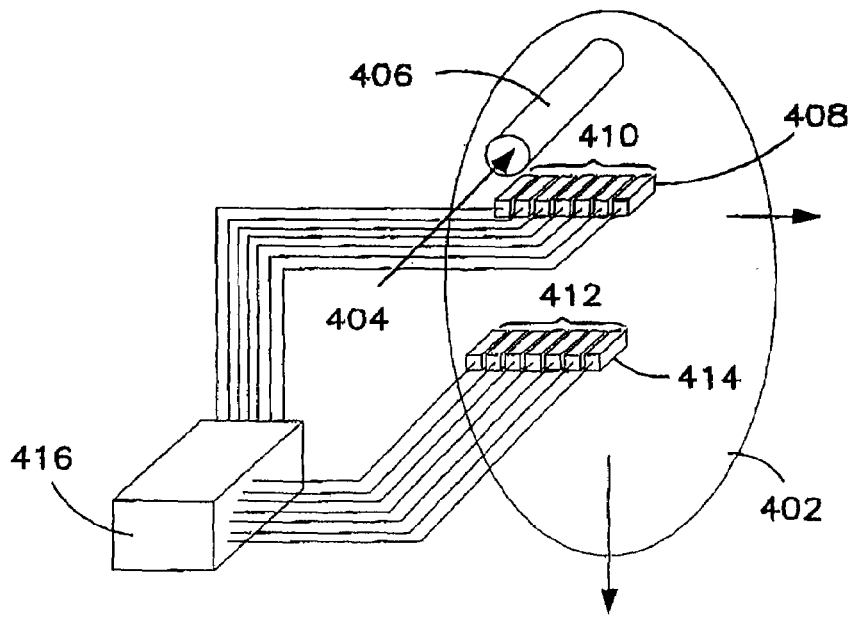
FIG. 4 is a schematic diagram of an alternate embodiment of a charge neutralization apparatus according to this invention.

Another embodiment of the invention is shown in FIG. 4. A semiconductor wafer 402 is subjected to an ion beam 404 in a known manner. As before, the ion beam may be optionally shrouded in a tube 406. A plurality of charge-sensing elements 408, intimately aligned in a linear array 410, sweeps across the wafer 402. The charge sensing array 410 generates parallel, effectively independent, real-time signals, such that each element of the array produces a signal that is indicative of the excess, i.e., uncompensated, charge under said charge-sensing element. Thus, the parallel signals from the discrete probe elements of the charge-sensing array provide a composite one-dimensional sampling of the excess charge along the breadth of the charge-sensing array. The charge-sensing array is followed by a segmented electron generator array 412 whose position is fixed with respect to the charge-sensing array and therefore the electron generator array moves in tandem with the charge sensing array. The segmented electron generator array is partitioned into subunits 414 that can be individually addressed and voltage-biased, simultaneously and in parallel, to produce distinct and independently controlled electron fluxes whereby the separate electron fluxes are generated by the individual and independently-biased subunits of the electron generator array.

The respective (parallel) signals generated from the charge-sensing array are sent to a controller/power supply combination 416. The controller produces a set of signals that are transmitted on a set of parallel lines, wherein each signal represents the excess charge sensed by a corresponding charge sensing element of the charge-sensing array. The signals control a multichannel high-voltage power supply that provides a set of high-voltages to the corresponding subunits of the electron generator array. In effect, each charge-sensing element of the charge-sensing array controls the voltage-bias of a correspondingly positioned segment of the electron generator array.

In practice, the motion of the charge-sensing array and segmented electron generator array relative to the wafer can be effected by translating the charge probe array and the electron generator array with respect to a stationary wafer, or by translating the wafer relative to a stationary charge sensor array/electron generator array combination.

Electron Generator Arrays

Figure 5:
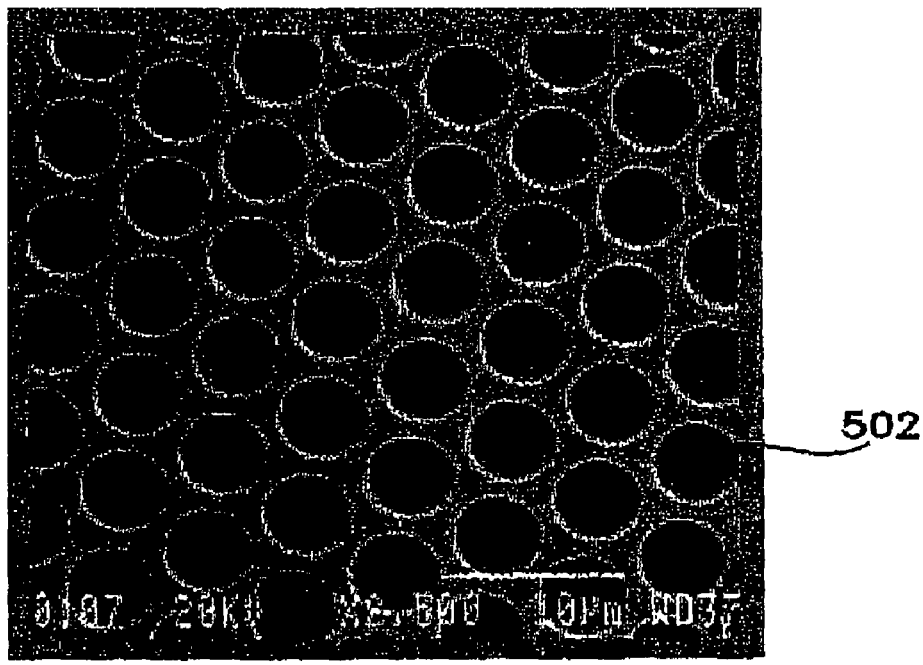
FIG. 5 is a photograph of a part of an electron generator array used in a charge neutralization apparatus according to this invention.

The present invention utilizes a device called an electron generator array that is described and shown in U.S. Pat. No. 6,239,549, the entire disclosure of which is incorporated herein by reference. The electron generator array is a combined electron emission source and multiplier that can be sized to provide either a narrow, collimated electron beam or a wide-area electron flux. The electron generator array is made by creating microscopic channels, with diameters on the order of 10 microns, in a planar sheet or plate. The electron generator array consists of millions of precision glass tubes fused together to produce a uniform and mechanically rigid structure. The surfaces of the glass are subjected to chemical treatments that modify the electron emission properties of the glass such that, when a voltage is applied across the thickness of the array, each microchannel emits a stream of electrons. With each of the millions of channel producing electrons, the resultant electron flux is extremely uniform and dense. A top plan view of an electron generator array is shown in FIG. 5. The symmetric arrangement of channels 502 is characteristic of these devices The electron generator array can be made in a variety of shapes with sizes ranging from several millimeters to over 100 millimeters.

Figure 6:
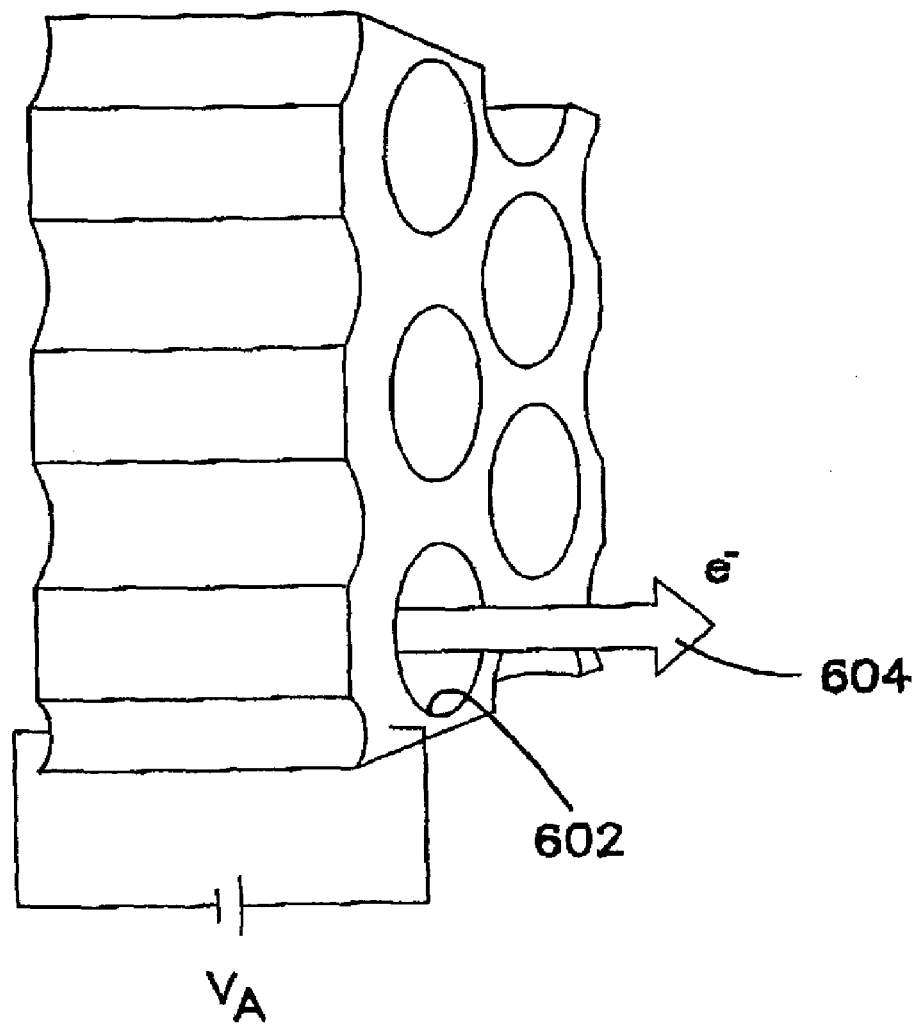
FIG. 6 is a partial schematic view of the electron generator array shown in FIG. 5.

As indicated in FIG. 6, which shows the electron emission for a single microchannel 602 as an example, the electron flux 604 can be controlled by an applied voltage $V_A$ which determines both the fluence, or equivalently, the electron current, as well as the energy distribution of the emitted electrons. In actuality, there would be a similar electron flux produced by every microchannel of the array.

Figure 7:
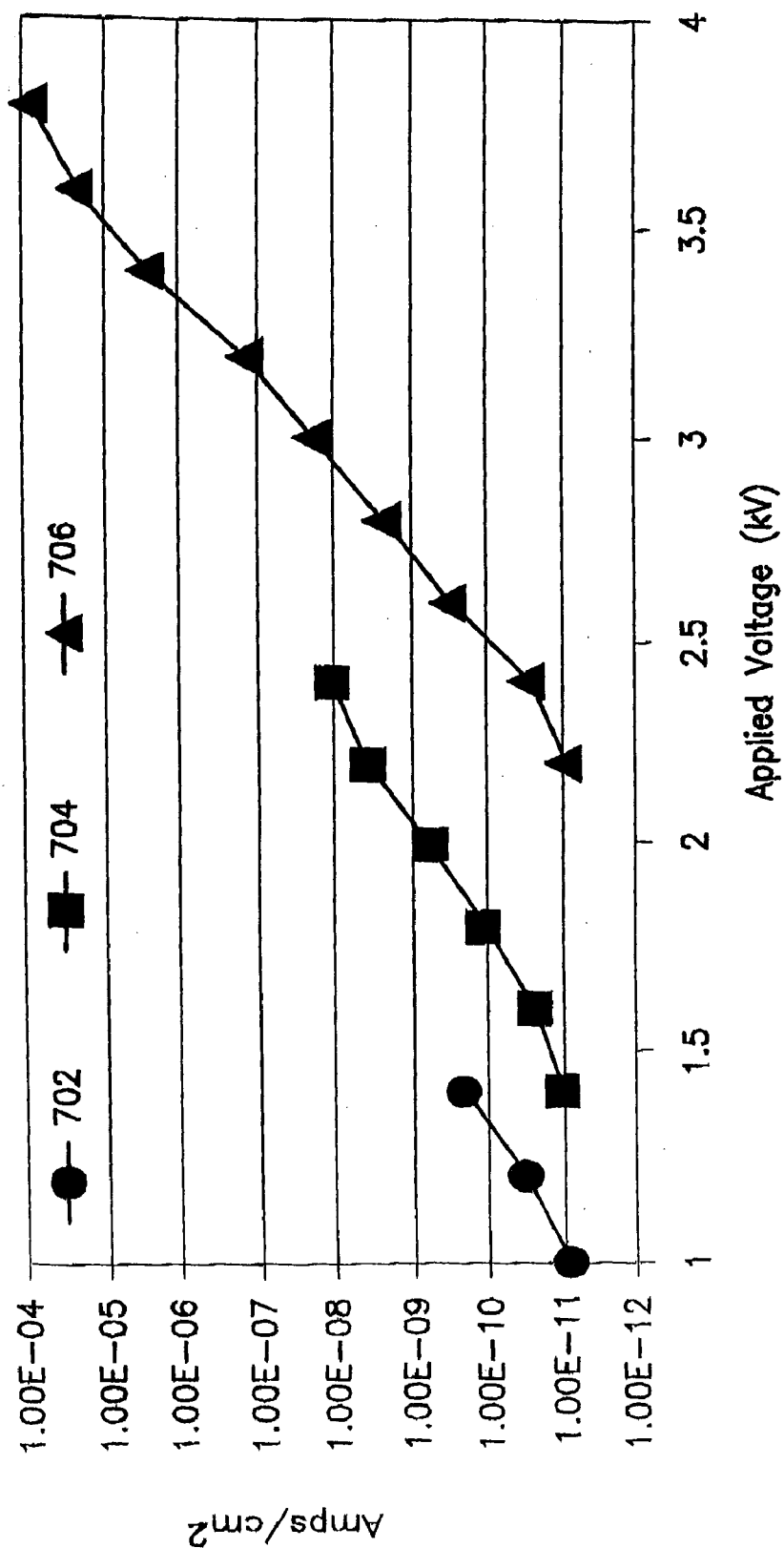
FIG. 7 is a series of graphs of electron flux density as a function of applied voltage bias for three geometric arrangements of microchannels in an electron generator array.

FIG. 7 is a plot of the electron flux density produced by an electron generator array as a linear function of applied voltage $V_A$. The plot shows output characteristics for three common electron generator geometries (single plate with parallel channels, (●'s); two plates with oblique channels in a chevron pattern with microchannels in the top and bottom plate oriented at opposing angles (■'s); and two plates with a "Z" stack of oblique microchannels, and with microchannels in both plates making the same angle with the horizontal plane of the array (▲'s). The threshold for emission that is evident for some geometries can be negated with an offset voltage in the control loop.

Figure 8:
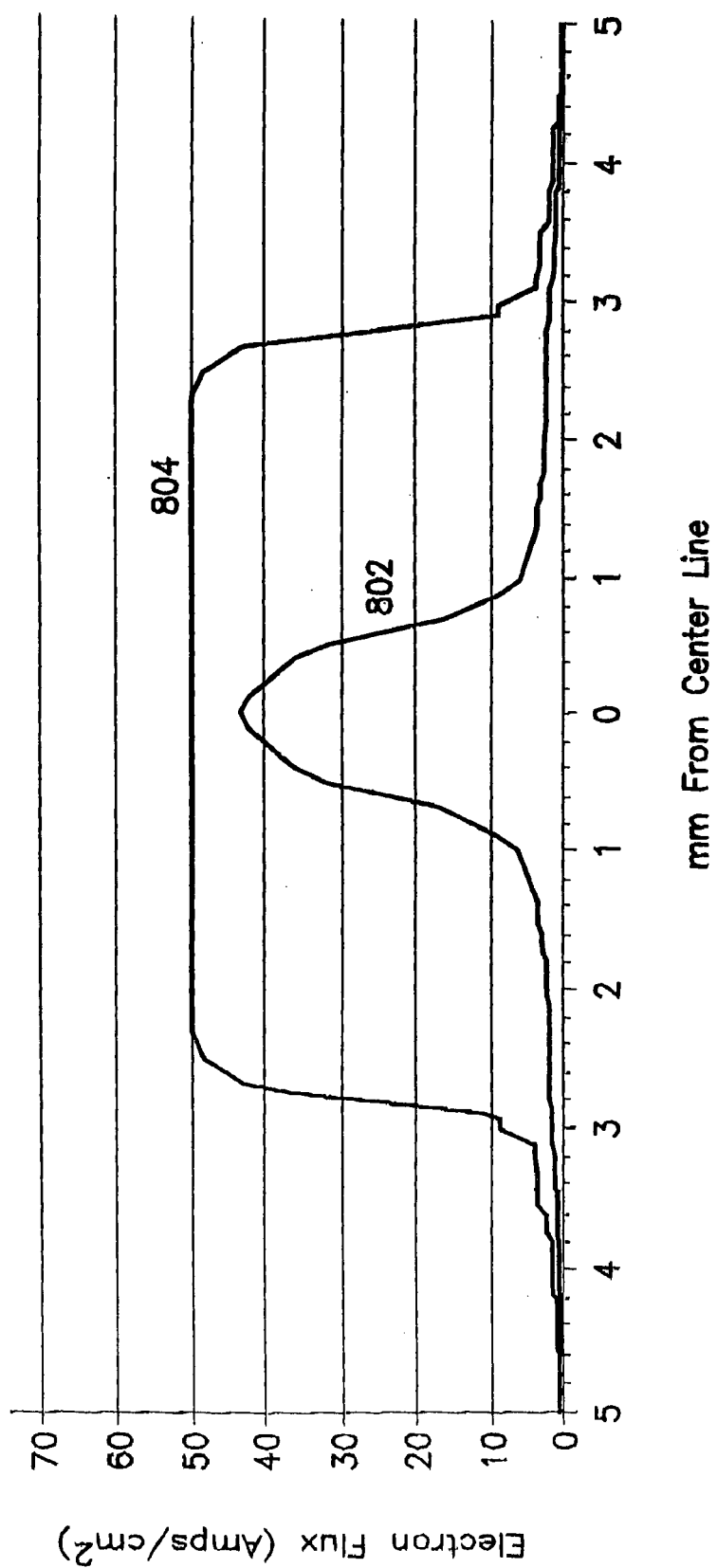
FIG. 8 is a graph of the electron flux density as a function of the lateral distance from the center of an electron generator array and as a function of the lateral distance from the center of a heated filament.

FIG. 8 shows the relative spatial uniformity of electron emission from an electron generator array by way of comparing the electron current density output of a heated filament 802 with that of an electron generator array 804. The flat, constant output of the electron generator array facilitates the uniform delivery of compensating electrons to the charged surface of the workpiece.

Surface Charges and Surface Charge Sensing

The present invention utilizes a device that senses surface charge. More specifically with regard to the present invention, a component of the present invention is a probe that registers an electrical signal in response to the localized charge imbalance on the surface or subsurface of a workpiece in a region of the workpiece that is in close proximity to the probe.

In the context of the present invention, the excess charge will result from ion implantation, however, the sources and/or causes of the excess charge that is neutralized by application of the invention need not result exclusively from ion implantation per se. In practice, excess charge may be the result of a combination of physical phenomena occurring during the processing and analysis of the workpiece.

It is not necessary for the probe to make contact with the surface of the workpiece. On the contrary, it would be generally preferable to use a non-contacting method of surface charge sensing in order to avoid contamination or damage to the workpiece, and in order to facilitate the relative motion of the charge-sensing probe and the workpiece. Non-contacting charge sensing probes are a well-developed technology—see for example, M. A. Noras, "Non-Contact Surface Charge/Voltage Measurements" *Trek Application Note* Number 3002 (TREK, Inc., Medina, N.Y., 2002).

A simple implementation of a charge-sensing probe is a conducting electrode, e.g., a metallic layer such as a gold film, formed on a dielectric substrate. The conducting electrode is connected by a wire to the input of an amplifier (e.g., a high-input-impedance operational amplifier). As is well-known in the science of electrostatics, when such a so-constructed probe is brought into close proximity of a charged surface, a charge is induced on or in the electrode of the probe. As the there is inherent capacitance between the probe electrode and the charged surface, the voltage between the charged electrode and charged surface is a function of the charge on the surface. Correspondingly, a transient current is associated with the charging of the electrode in response to its induction by the charged surface.

More sophisticated means of charge-sensing circuits are well-known in the art and can be considered alternative embodiments of the invention.

Advantages of the Invention

The invention described herein represents an improvement over currently available apparatuses and methods of neutralizing the accumulated charge on semiconductor wafers and other workpieces resulting from ion implantation processes. The advantages of the present invention are related to the ability to compensate excess charge based on real-time measurements of the spatially-varying excess surface charge on individual workpieces. Therefore, in the present invention, and in contrast to other methods, the charge compensation adapts to variations in charge over the surface of the workpiece due to spatially-dependent differences in charging characteristics of the workpiece, and due to variations from wafer to wafer stemming from random process fluctuations.

Other methods of charge compensation rely on predictions of excess charge, which are often inaccurate or unreliable because of the complexity of the charging process. Since the present invention does not rely on predictions or models of the excess charge distribution on a wafer, but instead directly measures the excess charge, a more exactly compensating dose of electrons can be proportioned for delivery to the wafer. Further, in the present invention, the compensating dose of electrons is automatically adjusted according to the wafer-to-wafer variations in excess charge from process fluctuations.

What is claimed:

1. Apparatus for neutralizing excess electrical charge on an ion-implanted workpiece comprising:
a charge sensing electrode adapted for being positioned adjacent to an ion-implanted workpiece;
a charged particle generator adapted for being positioned adjacent to the ion-implanted workpiece in spaced relation to said charge sensing electrode, said charged particle generator comprises an electron generator having a plurality of electron generating microchannels arranged in parallel alignment;
a high voltage power supply operatively connected to said charged particle generator; and
control means operatively connected to said charge sensing electrode and said high voltage power supply for generating a control signal in response to a charge sensing signal from said charge sensing electrode and applying said control signal to said high voltage power supply to adjust the output thereof, whereby the charged particle output of said charged particle generator can be adjusted.

2. Apparatus as set forth in claim 1 wherein said charge sensing electrode comprises a plurality of charge sensing elements and said electron generator comprises a plurality of electron generating subunits, each of said subunits being operatively associated with a respective charge sensing element.

3. Apparatus as set forth in claim 2 wherein said high voltage power supply comprises multiple output channels for providing a discrete voltage to each of said plurality of electron generating subunits and said control means comprises addressing means for providing to said high voltage power supply a unique address associated with one of said plurality of electron generating subunits such that an appropriate voltage can be applied to each of said plurality of electron generating subunits, whereby the electron output of each of said plurality of electron generating subunits can be adjusted individually.

4. Apparatus as set forth in claim 2 wherein said plurality of charge sensing elements are arranged in a first linear array and said plurality of electron generating subunits are arranged in a second linear array spaced from said first linear array.

5. Apparatus as set forth in claim 1 wherein said control means comprises a time delay circuit configured for time shifting the control signal to compensate for a time lag between sensing of electrical charge by said charge sensing electrode and generation of charged particles by said charged particle generator.

6. Apparatus as set forth in claim 1 wherein said control means comprises
means for digitally sampling an output signal from said charge sensing electrode and providing a digital signal, and
a microprocessor operatively connected to said digital sampling means for receiving the digital signal output, said microprocessor being programmed for generating the control signal for input to said high voltage power supply.

7. Apparatus for neutralizing excess electrical charge on an ion-implanted workpiece comprising:
a charge sensing electrode adapted for being positioned adjacent to an ion-implanted workpiece;
an electron generator array adapted for being positioned adjacent to the ion-implanted workpiece in spaced relation to said charge sensing electrode;
a high voltage power supply operatively connected to said electron generator array for applying a biasing voltage thereto; and
control means operatively connected to said charge sensing electrode and said high voltage power supply for generating a control signal in response to a charge sensing signal from said charge sensing electrode and applying said control signal to said high voltage power supply to adjust the output thereof, whereby the electron output of said electron generator array can be adjusted.

8. Apparatus as set forth in claim 7 wherein said electron generator array comprises a plurality of electron generating microchannels arranged in parallel alignment.

9. Apparatus as set forth in claim 8 wherein said plurality of electron generating microchannels are fixedly attached one to another to form a sheet or plate.

10. Apparatus as set forth in claim 7 wherein said charge sensing electrode comprises a plurality of charge sensing elements and said electron generator array comprises a plurality of electron generating sub-arrays, each of said sub-arrays being operatively associated with a respective charge sensing element.

11. Apparatus as set forth in claim 10 wherein said high voltage power supply comprises multiple output channels for providing a discrete voltage to each of said plurality of electron generating sub-arrays and said control means comprises addressing means for providing to said high voltage power supply a unique address associated with each of said plurality of electron generating sub-arrays such that an appropriate voltage can be applied to each of said plurality of electron generating sub-arrays, whereby the electron emission of each of said plurality of electron generating sub-arrays can be adjusted individually.

12. Apparatus as set forth in claim 10 wherein said plurality of charge sensing elements are arranged in a first linear array and said plurality of electron generating sub-arrays are arranged in a second linear array spaced from said first linear array.

13. Apparatus as set forth in claim 7 wherein said control means comprises a time delay circuit configured for time shifting the control signal to compensate for a time lag between sensing of electrical charge by said charge sensing electrode and generation of electrons by said electron generator array.

14. Apparatus as set forth in claim 7 wherein said control means comprises
means for digitally sampling an output signal from said charge sensing electrode and providing a digital signal, and
a microprocessor operatively connected to said digital sampling means for receiving the digital signal output, said microprocessor being programmed for generating the control signal for input to said high voltage power supply.

15. Apparatus as set forth in claim 14 wherein said charge sensing electrode comprises a plurality of charge sensing elements and said electron generator array comprises a plurality of electron generating sub-arrays, each of said sub-arrays being operatively associated with a respective charge sensing element.

16. Apparatus as set forth in claim 15 wherein said high voltage power supply comprises multiple output channels for providing a discrete voltage to each of said plurality of electron generating sub-arrays and said microprocessor is programmed to provide to said high voltage power supply a unique address associated with each of said plurality of electron generating sub-arrays such that an appropriate voltage can be applied to each of said plurality of electron generating sub-arrays, whereby the electron emission of each of said plurality of electron generating sub-arrays can be adjusted individually.

17. Apparatus for neutralizing excess electrical charge on an ion-implanted semiconductor wafer comprising:
a charge sensing electrode adapted for being positioned adjacent to an ion-implanted semiconductor wafer;
an electron generator array adapted for being positioned adjacent to the ion-implanted semiconductor wafer in fixed spaced relation to said charge sensing electrode;
a high voltage power supply operatively connected to said electron generator array for applying a biasing voltage thereto;
control means operatively connected to said charge sensing electrode and said high voltage power supply for generating a control signal in response to a charge sensing signal from said charge sensing electrode and applying said control signal to said high voltage power supply to adjust the output thereof, whereby the electron output of said electron generator array can be adjusted; and
means for providing relative motion between said charge sensing electrode, said electron generator array, and the semiconductor wafer such that said charge sensing electrode and said electron generator array can scan a surface of the semiconductor wafer.

18. Apparatus for neutralizing excess electrical charge on an ion-implanted workpiece comprising:
a charge sensing electrode comprising a plurality of charge sensing elements adapted for being positioned adjacent to an ion-implanted workpiece;
a charged particle generator adapted for being positioned adjacent to the ion-implanted workpiece in spaced relation to said charge sensing electrode, said charged particle generator comprising a plurality of charged particle generating subunits, each of said subunits being operatively associated with a respective charge sensing element;
a high voltage power supply operatively connected to said charged particle generator; and
control means operatively connected to said charge sensing electrode and said high voltage power supply for generating a control signal in response to a charge sensing signal from said charge sensing electrode and applying said control signal to said high voltage power supply to adjust the output thereof, whereby the charged particle output of said charged particle generator can be adjusted.

19. Apparatus as set forth in claim 18 wherein each of said charged particle generating subunits comprises an electron generating unit.

20. Apparatus as set forth in claim 19 wherein each of said electron generating units comprises a plurality of electron generating microchannels arranged in parallel alignment.

21. Apparatus as set forth in claim 18 wherein said high voltage power supply comprises multiple output channels for providing a discrete voltage to each of said plurality of charged particle generating subunits and said control means comprises addressing means for providing to said high voltage power supply a unique address associated with one of said plurality of charged particle generating subunits such that an appropriate voltage can be applied to each of said plurality of charged particle generating subunits, whereby the charged particle output of each of said plurality of charged particle generating subunits can be adjusted individually.

22. Apparatus as set forth in claim 18 wherein said plurality of charge sensing elements are arranged in a first linear array and said plurality of charged particle generating subunits are arranged in a second linear array spaced from said first linear array.

23. Apparatus as set forth in claim 18 wherein said control means comprises a time delay circuit configured for time shifting the control signal to compensate for a time lag between sensing of electrical charge by said charge sensing electrode and generation of charged particles by said charged particle generator.

24. Apparatus as set forth in claim 18 wherein said control means comprises
means for digitally sampling an output signal from said charge sensing electrode and providing a digital signal, and
a microprocessor operatively connected to said digital sampling means for receiving the digital signal output, said microprocessor being programmed for generating the control signal for input to said high voltage power supply.

* * * * *